United States Patent
Sakai et al.

(10) Patent No.: US 9,529,018 B2
(45) Date of Patent: Dec. 27, 2016

(54) CURRENT SENSOR

(71) Applicants: DENSO CORPORATION, Kariya, Aichi-pref. (JP); KYUSHU UNIVERSITY, NATIONAL UNIVERSITY CORPORATION, Fukuoka-shi, Fukuoka (JP)

(72) Inventors: Ryosuke Sakai, Kariya (JP); Norihiro Kurumado, Nagoya (JP); Kousuke Nomura, Nagoya (JP); Ichiro Sasada, Fukuoka (JP)

(73) Assignees: DENSO CORPORATION, Kariya (JP); KYUSHU UNIVERSITY, NATIONAL UNIVERSITY CORPORATION, Fukuoka-shi (JP)

( * ) Notice: Subject to any disclaimer, the term of this patent is extended or adjusted under 35 U.S.C. 154(b) by 357 days.

(21) Appl. No.: 14/360,391

(22) PCT Filed: Dec. 25, 2012

(86) PCT No.: PCT/JP2012/008261
§ 371 (c)(1),
(2) Date: May 23, 2014

(87) PCT Pub. No.: WO2013/099215
PCT Pub. Date: Jul. 4, 2013

(65) Prior Publication Data
US 2014/0333293 A1    Nov. 13, 2014

(30) Foreign Application Priority Data

Dec. 27, 2011  (JP) .................................. 2011-286446
Dec. 12, 2012  (JP) .................................. 2012-271568

(51) Int. Cl.
*G01R 15/18*    (2006.01)
*G01R 19/00*    (2006.01)
(Continued)

(52) U.S. Cl.
CPC ............ *G01R 15/183* (2013.01); *G01R 15/207* (2013.01); *G01R 19/0092* (2013.01); *H01F 38/30* (2013.01); *G01R 15/202* (2013.01)

(58) Field of Classification Search
None
See application file for complete search history.

(56) References Cited

U.S. PATENT DOCUMENTS

| | | | | |
|---|---|---|---|---|
| 5,583,429 | A * | 12/1996 | Otaka ................... | G01R 15/202 324/117 H |
| 2002/0145416 | A1* | 10/2002 | Attarian ............... | G01R 15/183 324/127 |
| 2006/0017435 | A1* | 1/2006 | Kang .................... | H05K 1/165 324/249 |

FOREIGN PATENT DOCUMENTS

| | | |
|---|---|---|
| JP | 05-333058 A | 12/1993 |
| JP | 6-18977 U | 3/1994 |

(Continued)

OTHER PUBLICATIONS

Office Action mailed Sep. 1, 2015 in the corresponding CN application No. 201280064942.5 (with English translation).
(Continued)

*Primary Examiner* — Jermele M Hollington
*Assistant Examiner* — Suresh K Rajaputra
(74) *Attorney, Agent, or Firm* — Posz Law Group, PLC

(57) ABSTRACT

A current sensor includes: a magneto electric conversion element; and a magnetic field concentrating core applying a magnetic field caused by a measurement object current to the magneto electric conversion element. A planar shape of the magnetic field concentrating core perpendicular to a current flowing direction is a ring shape with a gap. The magneto electric conversion element is arranged in the gap. A part of a conductor for flowing the current is surrounded by the magnetic field concentrating core. The magnetic field (Continued)

concentrating core includes two first magnetic members and at least one second magnetic member, which are stacked alternately in the current flowing direction. Parts of the two first magnetic members adjacent to each other via the one second magnetic member are opposed to each other through a clearance or an insulator.

10 Claims, 14 Drawing Sheets

(51) Int. Cl.
*H01F 38/30* (2006.01)
*G01R 15/20* (2006.01)

(56) References Cited

FOREIGN PATENT DOCUMENTS

| JP | 2007-40758 A | 2/2007 |
| JP | 2011-193622 A | 9/2011 |

OTHER PUBLICATIONS

International Search Report of the International Searching Authority mailed Feb. 5, 2013 for the corresponding international application No. PCT/JP2012/008261 (with English translation).
Written Opinion of the International Searching Authority mailed Feb. 5, 2013 for the corresponding international application No. PCT/JP2012/008261 (with English translation).

* cited by examiner

CURRENT SENSOR

CROSS REFERENCE TO RELATED APPLICATION

The present application is a U.S. national stage application of PCT/JP2012/008261 filed on Dec. 25, 2012 and is based on Japanese Patent Applications No. 2011-286446 filed on Dec. 27, 2011, and No. 2012-271568 filed on Dec. 12, 2012, the contents of which are incorporated herein by reference.

TECHNICAL FIELD

The present disclosure relates to a current sensor including a magneto electric conversion element, and a magnetic field concentrating core for concentrating a measurement object magnetic field caused by a measurement object current and for applying a concentrated measurement object magnetic field to the magneto electric conversion element.

BACKGROUND ART

Conventionally, for example, as described in Patent Literature No. 1, Patent Literature No. 1 proposes a current sensor including: a core for providing a first magnetic flux according to the measurement object current, the core formed to have a ring shape with a gap and to surround a part of a current path, in which current (i.e., the measurement object current) as a measurement object flows; and a magnetic sensor arranged in the gap. The above described core is formed by multiple layers, which are stacked and made of magnetic material having a plate shape.

Here, it is considered that, in the current sensor described in Patent Literature No. 1, the number of stacking layers made of magnetic material increases so as to restrict magnetic saturation of the core, and a cross sectional shape of the core perpendicular to a flowing direction of the first magnetic flux is enlarged. When the cross sectional shape is enlarged, a demagnetizing field for reducing a density of the first magnetic flux increases. Thus, the magnetic saturation of the core is restricted. However, when the measurement object current is an alternating current, the following difficulties may arise.

When the alternating current flows in the current path, an eddy current for generating a magnetic field, which cancels the first magnetic flux, arises in the core. In view of a macroscopic perspective, one large eddy current seems to be generated at an outer skin of the core. The larger the cross sectional area of the core and the shorter a total length of the outline of the outer shape of the cross sectional shape of the core, the larger the macroscopic eddy current. Accordingly, even if the cross sectional area of the core is enlarged in order to restrict the magnetic saturation of the core, a distribution of the first magnetic flux flowing through the core may be varied by the eddy current, so that a detection accuracy of the current is reduced.

PRIOR ART LITERATURES

Patent Literature

[Patent Literature 1]
JP-A-2007-40758

SUMMARY OF INVENTION

It is an object of the present disclosure to provide a current sensor, in which reduction of a detection accuracy of current is restricted.

According to an aspect of the present disclosure, a current sensor includes: a magneto electric conversion element for converting an applied magnetic field to an electric signal, and a magnetic field concentrating core for concentrating a measurement object magnetic field caused by a measurement object current and for applying a concentrated measurement object magnetic field to the magneto electric conversion element. The magnetic field concentrating core has a planar shape perpendicular to a flowing direction of the measurement object current, which is a ring shape with a gap. The magneto electric conversion element is arranged in the gap. A part of a measurement object conductor, through which an alternating current as the measurement object current flows, is surrounded by the magnetic field concentrating core. The magnetic field concentrating core includes at least two first magnetic members made of a first magnetic material and at least one second magnetic member made of a second magnetic material, which are stacked alternately in the flowing direction of the alternating current. Parts of the at least two first magnetic members, which are adjacent to each other via the at least one second magnetic member, are opposed to each other through a clearance or an insulator.

In the above current sensor, since the macroscopic eddy current is small, the variation of the distribution of the measurement object magnetic field flowing through the core caused by the eddy current is restricted. Further, the reduction of the measurement object magnetic field applied to the magnetic electric conversion element is restricted. Furthermore, since the variation of the distribution of the measurement object magnetic field flowing through the core and the reduction of the measurement object magnetic field are restricted, the reduction of the detection accuracy of the current is restricted.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Embodiments of the present invention will be explained with reference to drawings.

First Embodiment

Figure 1:
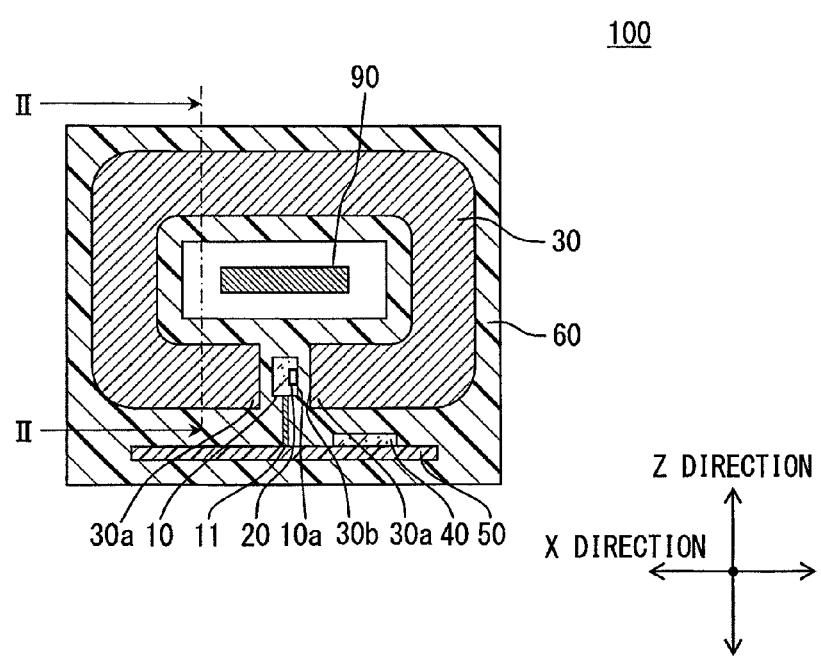
FIG. 1 is a cross sectional view of a rough structure of the current sensor according to a first embodiment.
Figure 2:
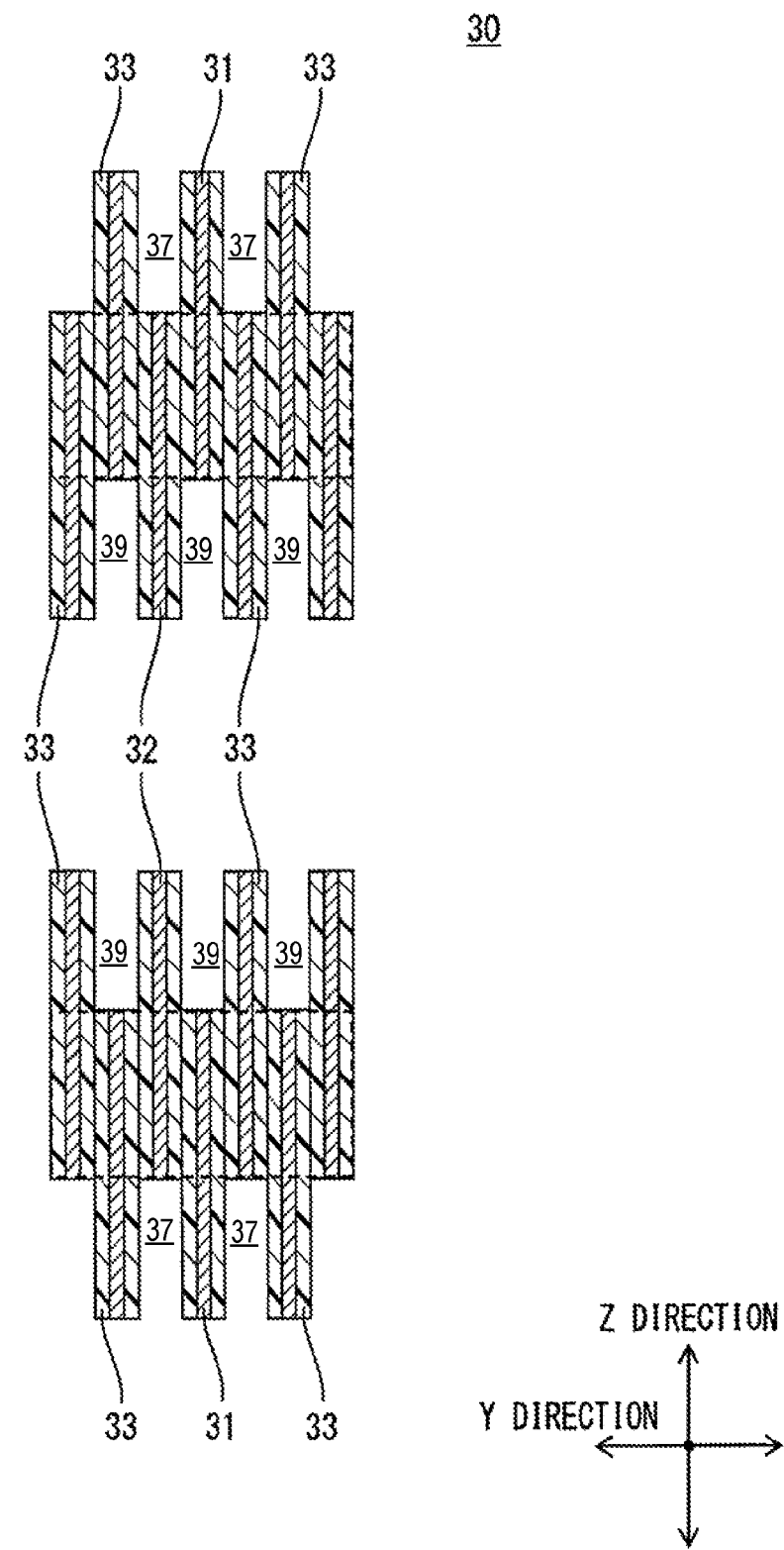
FIG. 2 is a cross sectional view of a magnetic field concentrating core taken along line II-II in FIG. 1.
Figure 12:
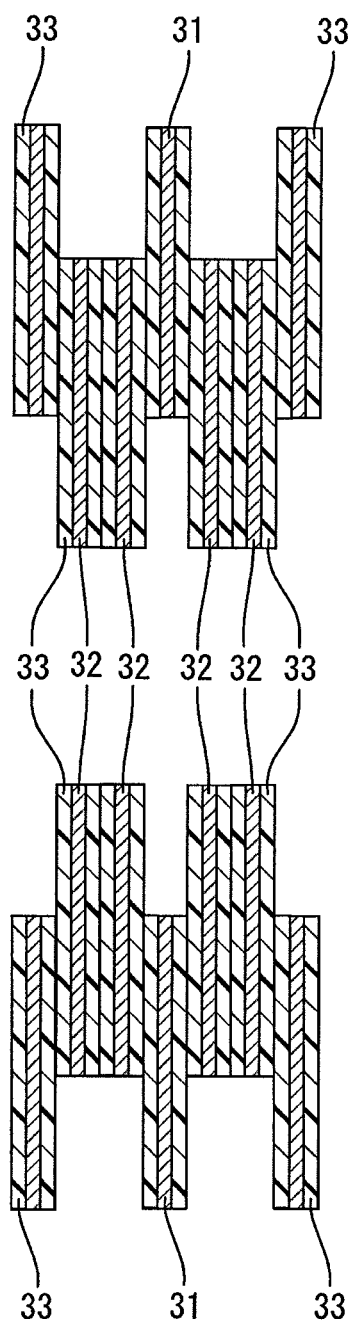
FIG. 12 is a cross sectional view showing another modification of the magnetic field concentrating core.
Figure 12:
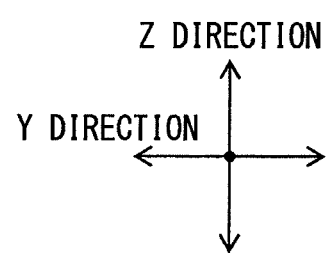
Figure 13:
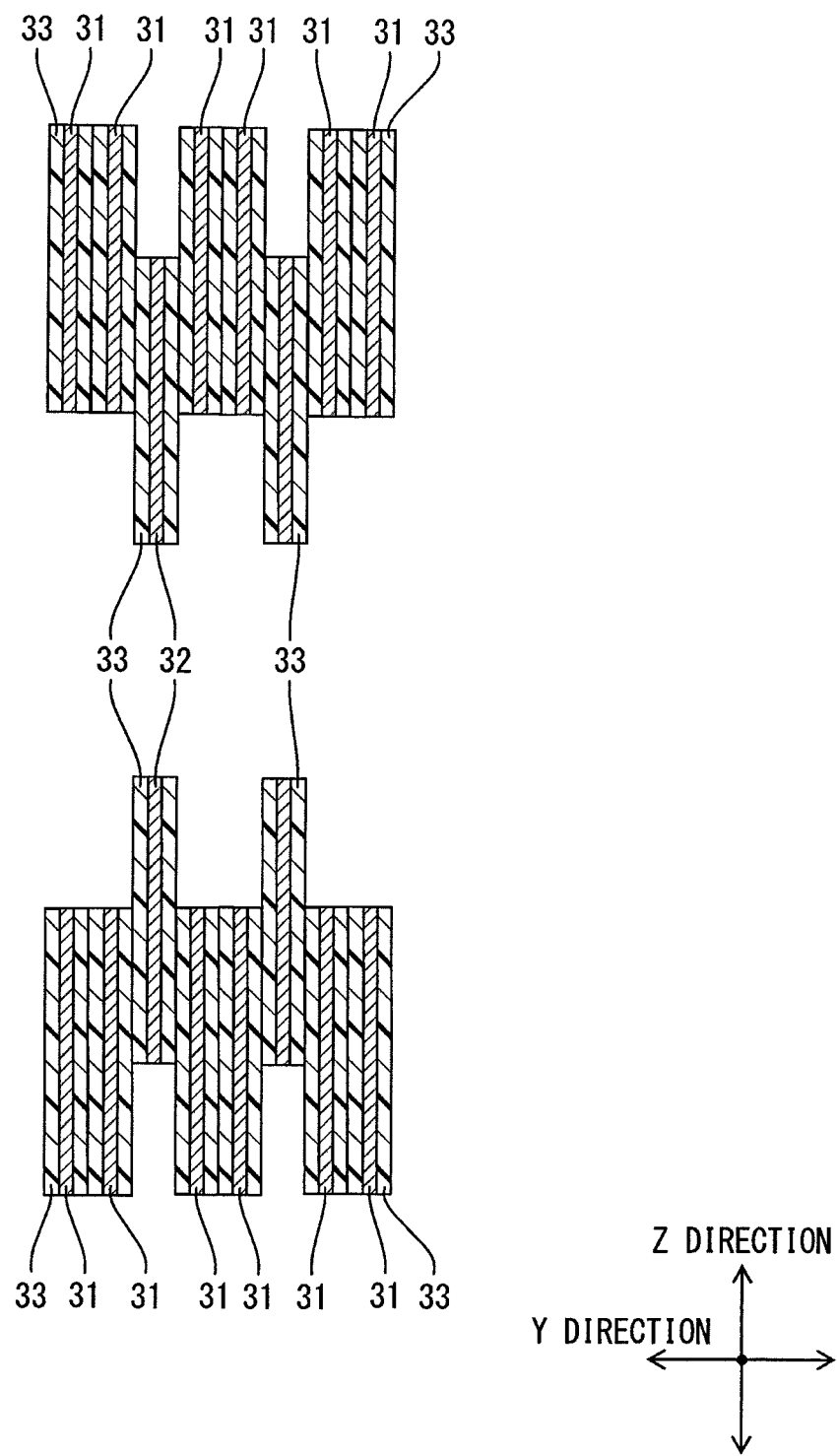
FIG. 13 is a cross sectional view showing another modification of the magnetic field concentrating core.
Figure 14:
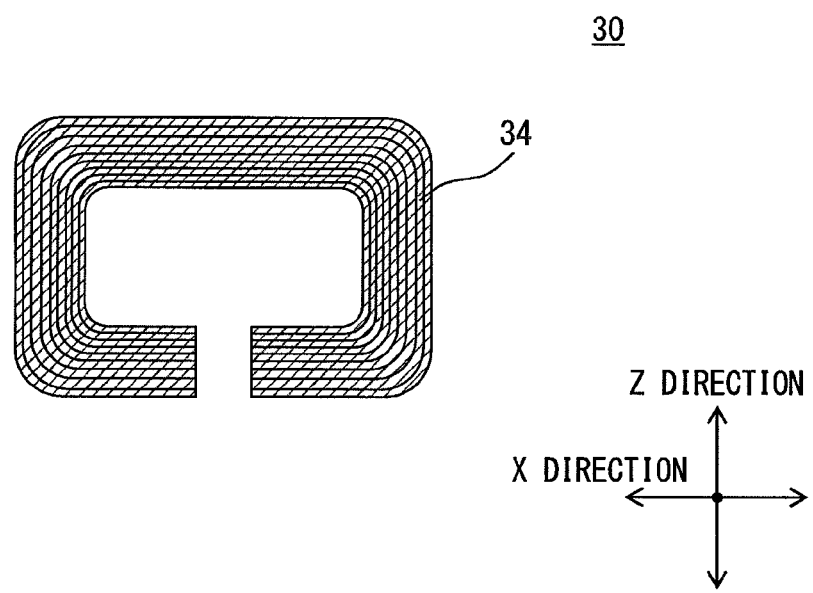
FIG. 14 is a cross sectional view showing another modification of the magnetic field concentrating core.

A current sensor 100 according to the present embodiment will be explained with reference to FIG. 1 to FIG. 3(b). Hereinafter, three directions, which are perpendicular to each other, are defined as a X direction, a Y direction and a Z direction. The Y direction corresponds to the flowing direction. Here, FIG. 1 shows a cross sectional view along a X-Z plane, which is defined by the X direction and the Z direction. FIG. 2 shows a cross sectional view along a Y-Z plane, which is defined by the Y direction and the Z direction. Further, later described FIG. 4 to FIG. 13 are cross sectional views along a Y-Z plane. FIG. 14 is a cross sectional view along a X-Z plane. In FIG. 2, a case 60 is not shown. The cross sectional views of FIG. 4 to FIG. 13 correspond to FIG. 2. Thus, the cross sectional views shown in FIG. 4 to FIG. 13 are cross sectional views taken along line II-II in FIG. 1.

The current sensor 100 mainly includes a sensor substrate 10, a magneto electric conversion element 20 formed on the sensor substrate 10, and a magnetic field concentrating core 30 for surrounding each of the sensor substrate 10 and a measurement object conductor 90, in which a measurement object current flows in the Y direction. The current sensor 100 measures the measurement object current based on the variation of an output signal of the magneto electric conversion element 20, which is caused by the magnetic field (i.e., a measurement object magnetic field) generated by the measurement object current. The current sensor 100 according to the present embodiment further includes a circuit board 40, a support substrate 50 and a case 60 in addition to the above described elements 10 to 30. Here, the measurement object current is an alternating current.

The sensor substrate 10 is made of a semiconductor substrate. The magneto electric conversion element 20 is formed on one side 10a (i.e., a formation surface 10a) of the sensor substrate 10. As shown in FIG. 1, the sensor substrate 10 is supported by the support substrate 50 via a junction member 11 having conductivity. The sensor substrate 10 is electrically connected to the circuit board 40, which is fixed to the support substrate 50.

The magneto electric conversion element 20 according to the present embodiment is a Hall element having a voltage (i.e., a Hall voltage), which is varied with an applied magnetic field. The magneto electric conversion element 20 has a property such that the voltage of the magneto electric conversion element 20 is varied with the applied magnetic field crossing the formation surface 10a. Although not shown in the drawings, the magneto electric conversion element 20 includes two terminals for flowing the current in one direction along the formation surface 10a and two detection terminals arranged along the formation surface 10a and arranged side by side in another direction perpendicular to the one direction. A line connecting two terminals and another line connecting two detection terminals provide a cross shape. When the current flowing between two terminals crosses the magnetic flux, a Hall voltage is generated in a direction perpendicular to a magnetic flux applying direction and a current flowing direction. The Hall voltage is detected by the above described two detection terminals.

The magnetic field concentrating core 30 is made of material having a high permeability. The magnetic field concentrating core 30 has a planar shape on the X-Z plane, which is a ring shape with a gap (i.e., a planar C-shape). Two ends 30a are arranged in the X direction, so that the gap is formed. The sensor substrate 10 is arranged in the gap. An end surface 30b of the end 30a and the formation surface 10a are in parallel to the Y-Z plane, and the end surface 30b and the formation surface 10a are opposed to each other in the X direction.

The magnetic flux concentrated by the magnetic field concentrating core 30 flows around through the magnetic field concentrating core 30. Then, the magnetic flux is discharged from one end 30a. A part of the discharged magnetic flux is released to an outside, and the other part of the discharged magnetic flux flows into the other end 30a. Then, the other part of the discharged magnetic flux flows around through the magnetic field concentrating core 30 again. As described above, since the sensor substrate 10 is arranged in the gap formed between two ends 30a, the magnetic flux discharged from one end 30a is applied to the formation surface 10a. The applied magnetic field generates the Hall voltage. The Hall voltage is output to the circuit board via the junction member 11.

The circuit board 40 is that a processing circuit for processing an output signal from the magneto electric conversion element 20 is formed on a semiconductor substrate. The circuit board 40 provides a function for calculating a current value of the measurement object current based on the Hall voltage. The circuit board 40 together with the junction member 11 is mounted on the support substrate 50.

The support substrate 50 is that a wiring for connecting the junction member 11 and the circuit board 40 electrically is formed on a substrate made of non-magnetic material. The substrates 10, 40 are electrically connected with each other via the junction member 11 and the above described wiring.

The case 60 accommodates the sensor substrate 10, the circuit board 40 and the support substrate 50. The case 60 according to the present embodiment is made of resin mold, which fixes the sensor substrate 10, the circuit board 40 and the support substrate 50 integrally, and covers them in order to protect. The case 60 is made of material having non-magnetism and insulation property.

Next, characteristics of the current sensor 100 according to the present embodiment will be explained. As shown in FIG. 2, the magnetic field concentrating core 30 is formed by stacking the first magnetic material 31 and the second magnetic material 32 alternately in the Y direction. A part of the first magnetic material 31 adjacent to each other via the second magnetic material 32 faces each other via a clearance 37. The first and second magnetic materials 31, 32 have a plate shape, which has a main surface perpendicular to the Y direction, and a planar shape on the Y-Z plane is a ring shape (i.e., planar C-shape) with the gap. The magnetic field concentrating core 30 according to the present embodiment is formed, as shown in FIG. 2, such that an inside portion of the first magnetic material 31 and an outside portion of the second magnetic material 32 are connected with each other, two outside portions of the first magnetic material 31 adjacent to each other are opposed to each other via the clearance 37, and two inside portions of the second magnetic material 32 adjacent to each other are opposed to each other via the clearance 39, so that the first magnetic material 31 and the second magnetic material 32 are stacked alternately.

In the present embodiment, an insulation material 33 is formed on the main surface of each of the first magnetic material 31 and the second magnetic material 32. The magnetic materials 31, 32 are connected to each other via two insulation materials 33. The constitutional material of the insulation material 33 may be preferably material having insulation and low dielectric properties in order to isolate the magnetic materials 31, 32 electrically and to restrict generation of macroscopic eddy current.

Figure 3A:
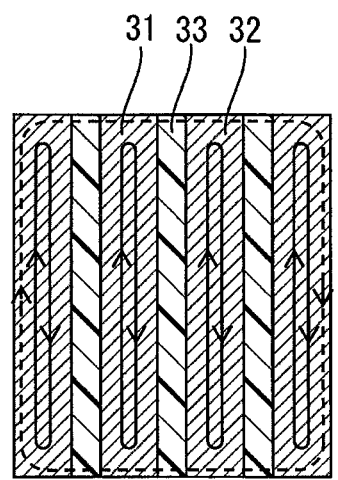
FIG. 3(a) is a diagram showing an eddy current generated at the magnetic field concentrating core.
Figure 3B:
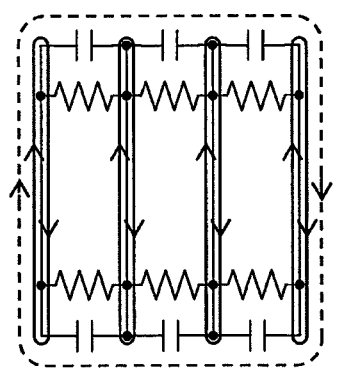
FIG. 3(b) shows an equivalent circuit of the core.

As shown in FIGS. 3(a) and 3(b), a capacitor is formed by the magnetic materials 31, 32, which face each other via the insulation material 33. An impedance between the magnetic materials 31, 32 is inversely proportion to a dielectric constant of the insulation material 33 and a frequency of the alternating current. When the frequency of the alternating current is low, the impedance is high. In this case, an eddy current (shown as a solid line arrow in FIGS. 3(a) and 3(b)) is generated in each of the magnetic material 31, 32 independently. When the frequency of the alternating current is high, the impedance is low. In this case, the magnetic materials 31, 32 are easily electrically connected to each other. In this case, the macroscopic eddy current shown as a broken line in FIGS. 3(a) and 3(b) is easily generated. Accordingly, it is preferable that the constitutional material of the insulation material 33 is a material having a low dielectric constant.

Next, a function effect of the current sensor 100 according to the present embodiment will be explained. As described above, the magnetic field concentrating core 30 is formed by stacking the first magnetic material 31 and the second magnetic material 32 alternately in the Y direction. A part of the first magnetic material 31 adjacent to each other via the second magnetic material 32 faces each other via a clearance. In this case, the cross sectional area of the magnetic field concentrating core 30 is the same as a case where a whole area of the main surface of the first magnetic material and a whole area of the main surface of the second magnetic material are connected to each other. However, a total length of an outline of an outer shape of the cross sectional shape of the magnetic field concentrating core 30 becomes elongated. Further, the eddy current flowing in the part of the first magnetic material 31, which is not connected to the second magnetic material 32, cancels each other. Accordingly, a generation region of the macroscopic eddy current is a region (which is a region shown as a broken line in FIG. 2), in which a part of the first magnetic material 31 and a part of the second magnetic material 32 are connected to each other. Accordingly, the magnitude of the substantial eddy current is small. Thus, as described above, since the macroscopic eddy current is small, the variation of the distribution of the measurement object magnetic field flowing through the magnetic field concentrating core 30 caused by the eddy current is restricted.

The cross sectional area of the magnetic field concentrating core 30 and the surface area of the end surface 30b are composed of a side of each of: the inside portion of the first magnetic material 31 and the outside portion of the second magnetic material 32, which are connected to each other; the outside portion of the first magnetic material 31; and the inside portion of the second magnetic material 32. The measurement object magnetic field discharged from the magnetic field concentrating core 30 is in proportion to the surface area of the end surface 30b. Thus, the reduction of the measurement object magnetic field applied to the magneto electric conversion element 20 is restricted, compared with a case where the surface area of the end surface 30b is composed of a side of the first magnetic material 31 and the second magnetic material 32, which are connected to each other. Thus, as described above, the variation of the distribution and the reduction of the measurement object magnetic field flowing through the magnetic field concentrating core 30 are restricted. Thus, the reduction of the detection accuracy of the current is restricted.

Here, the surface area of a region shown as a broken line in FIG. 2 is equal to the surface area of an addition surface. The magnitude of the surface area of the region is larger than the surface area of a facing surface the magneto electric conversion element 20 facing the end surface 30b.

The inside portions of the second magnetic material 32 adjacent to each other via one first magnetic material 31 are opposed to each other via a clearance. In this case, the increase of the dimensions of the magnetic field concentrating core 30 is restricted, compared with a case where the inside portions of the second magnetic material 32 adjacent to each other via multiple first magnetic materials 31 are opposed to each other via a clearance. As a result, the increase of the dimensions of the current sensor 100 is restricted.

The outside portions of the first magnetic material 31 adjacent to each other via one second magnetic material 32 are opposed to each other via a clearance. In this case, the increase of the dimensions of the magnetic field concentrating core 30 is restricted, compared with a case where the first magnetic material adjacent to each other via multiple second magnetic materials are opposed to each other via a clearance. As a result, the increase of the dimensions of the current sensor 100 is restricted.

The first magnetic material 31 and the second magnetic material 32 are connected to each other via two insulation materials 33. In this case, the electric coupling between the magnetic materials 31, 32 is reduced, so that the generation of the eddy current is restricted. Thus, the reduction of the measurement object magnetic field flowing through the magnetic field concentrating core 30 is restricted, and the reduction of the detection accuracy of the current is restricted.

The sensor substrate 10, the circuit board 40 and the support substrate 50 are integrally fixed in the case 60 so that the sensor substrate 10, the circuit board 40 and the support substrate 50 are covered and protected. In this case, an unwanted electric connection between unintended portions via a foreign particle having conductivity is restricted. Further, a mechanical strength of a connection between the sensor substrate 10, the circuit board 40 and the support substrate 50 is improved.

The present embodiment provides an example such that two first magnetic materials 31 adjacent to each other are opposed to each other via the clearance, and two second magnetic materials 32 adjacent to each other are opposed to each other via the clearance. Alternatively, a constitution may be provided that two first magnetic materials 31 adjacent to each other may be opposed to each other via an insulator (not shown), and two second magnetic materials 32 adjacent to each other may be opposed to each other via an insulator (not shown).

Figure 4:
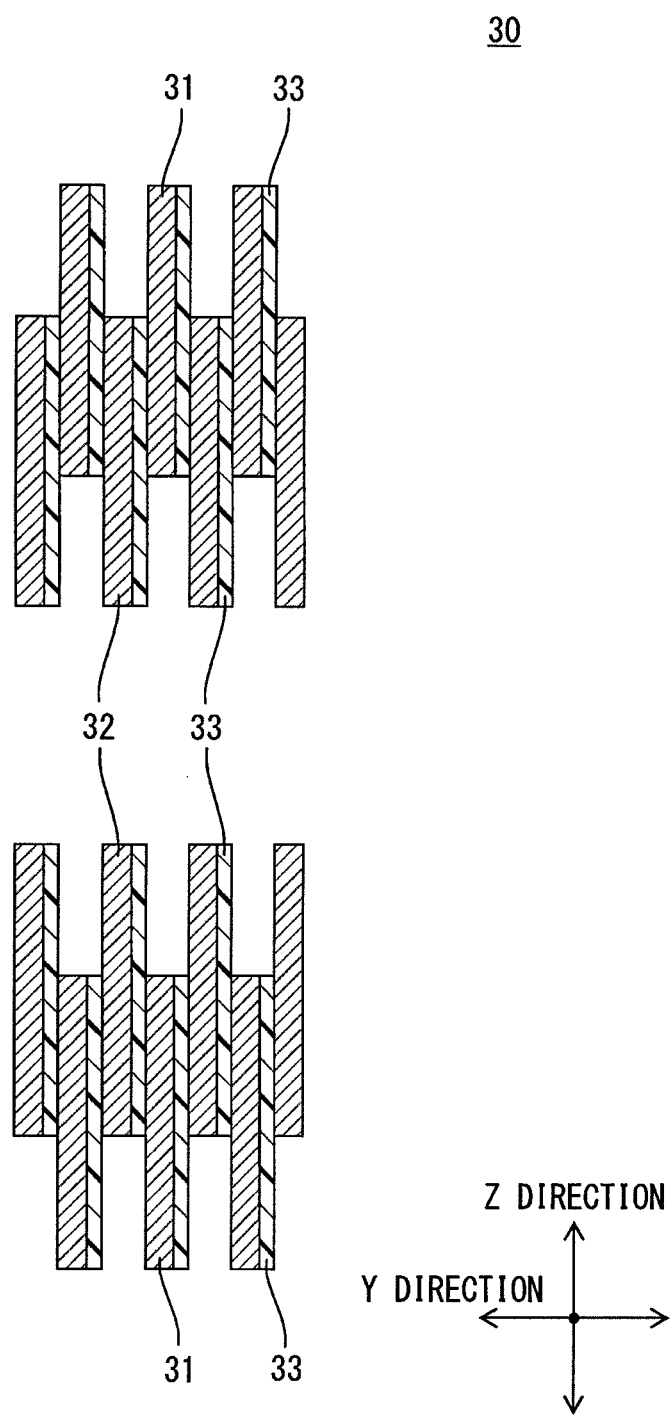
FIG. 4 is a cross sectional view showing a modification of the magnetic field concentrating core.
Figure 5:
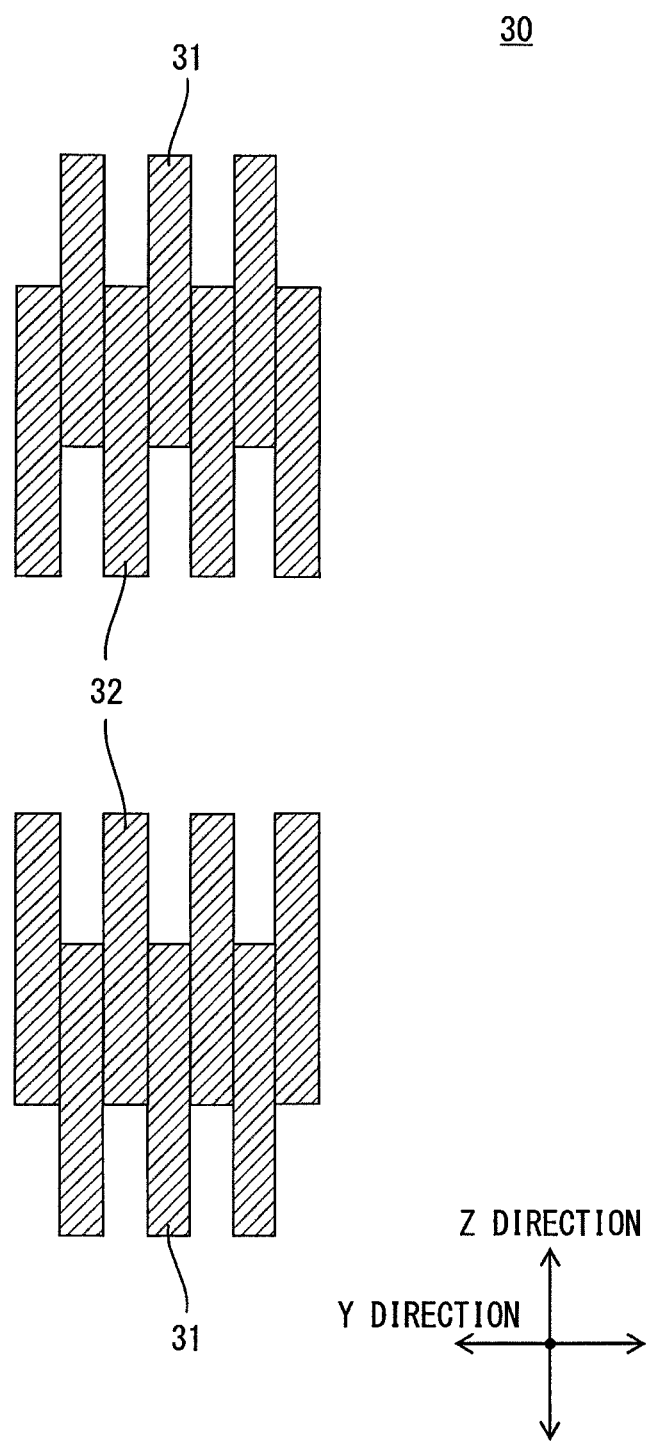
FIG. 5 is a cross sectional view showing another modification of the magnetic field concentrating core.

In the present embodiment, the insulation material 33 is formed on the main surface of each of the first magnetic material 31 and the second magnetic material 32. The present embodiment provides an example such that the first magnetic material 31 and the second magnetic material 32 are bonded to each other via two insulation materials 33, which are formed on the first magnetic material 31 and the second magnetic material 32, respectively. Alternatively, as shown in FIG. 4, a constitution may be provided such that the insulation material 33 is formed on the main surface of one of the first magnetic material 31 and the second magnetic material 32, so that the first magnetic material 31 and the second magnetic material 32 are bonded to each other via one insulation material 33. Alternatively, as shown in FIG. 5, a constitution may be provided such that the first magnetic material 31 and the second magnetic material 32 are bonded to each other without the insulation material 33.

Figure 6:
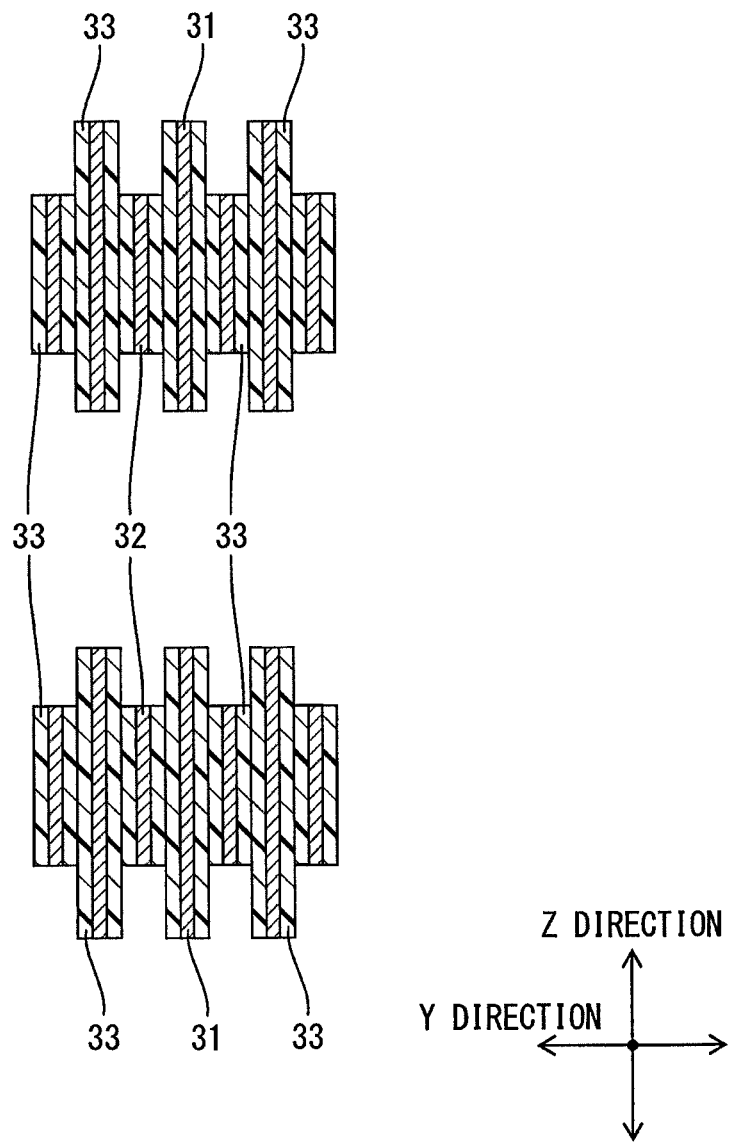
FIG. 6 is a cross sectional view showing another modification of the magnetic field concentrating core.
Figure 7:
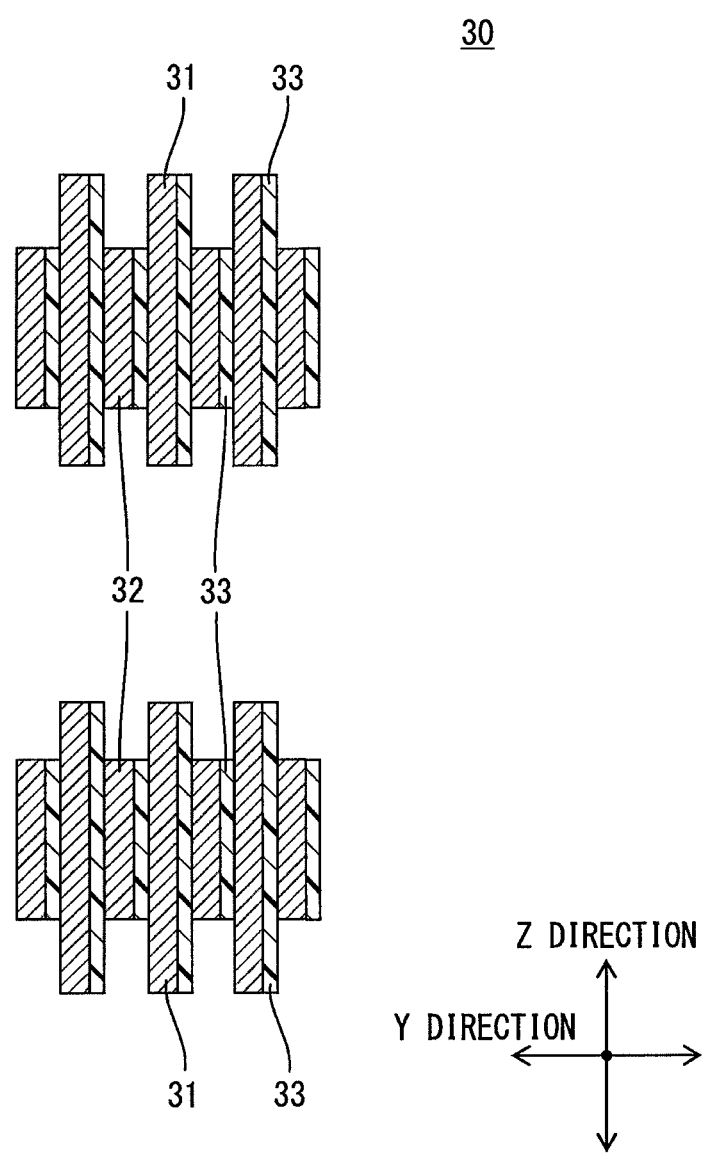
FIG. 7 is a cross sectional view showing another modification of the magnetic field concentrating core.
Figure 8:
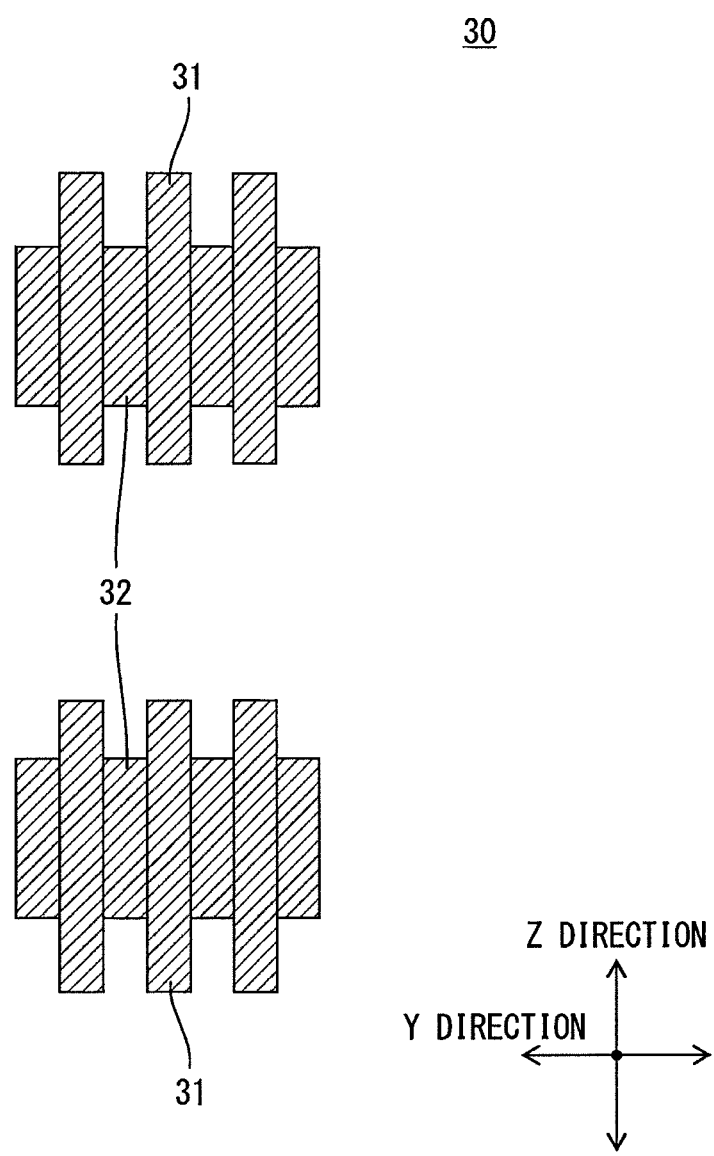
FIG. 8 is a cross sectional view showing another modification of the magnetic field concentrating core.

The present embodiment provides an example such that the inside portion of the first magnetic material 31 and the outside portion of the second magnetic material 32 are connected to each other, the outside portions of two first magnetic materials 31 adjacent to each other are opposed to each other via the clearance, and the inside portions of two second magnetic materials 32 adjacent to each other are opposed to each other via the clearance. Alternatively, as shown in FIGS. 6 to 8, a constitution may be provided such that the center of the main surface of the first magnetic material 31 and a whole of the main surface of the second magnetic material 32 may be connected to each other, and the outside portion of the first magnetic materials 31 adjacent to each other and the outside portion of the first magnetic material 31 are opposed to each other via the clearance, and one of the inside portions (i.e., one end) of the first magnetic materials 31 adjacent to each other and the other of the inside portions (i.e., the other end) of the first magnetic materials 31 are opposed to each other via the clearance. In this modification, the length of the second magnetic material 32 in the Z direction is shorter than the first magnetic material 31.

Figure 9:
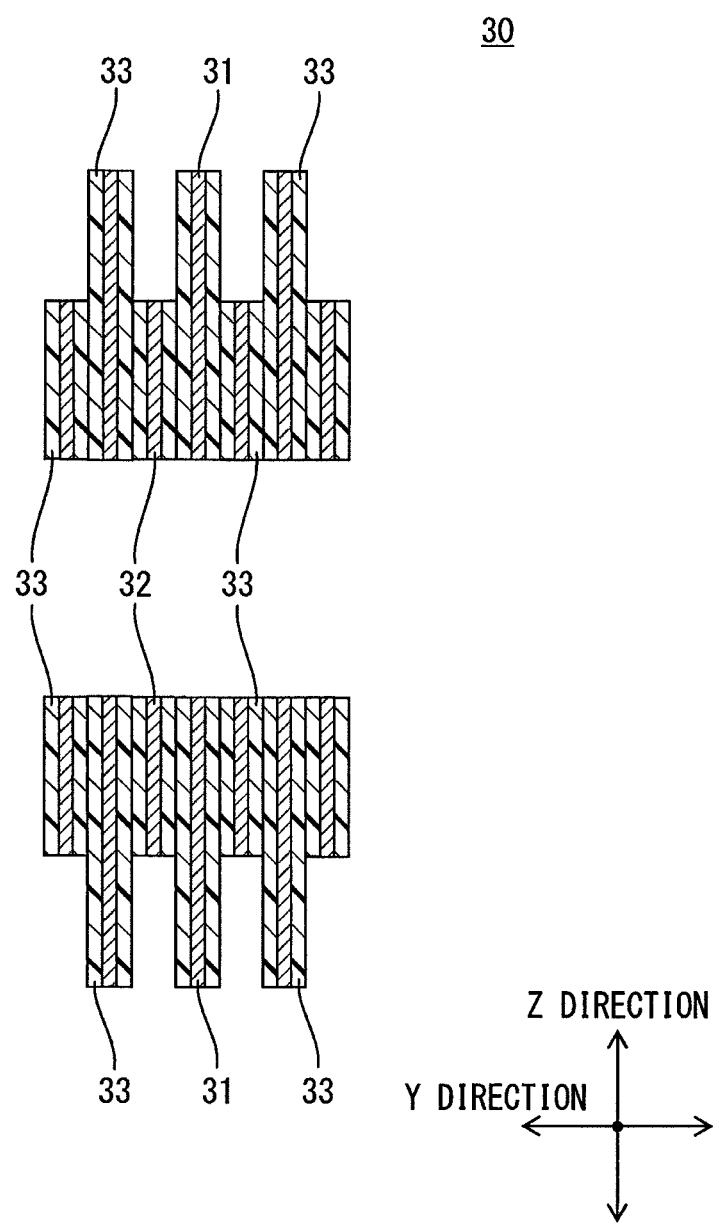
FIG. 9 is a cross sectional view showing another modification of the magnetic field concentrating core.
Figure 10:
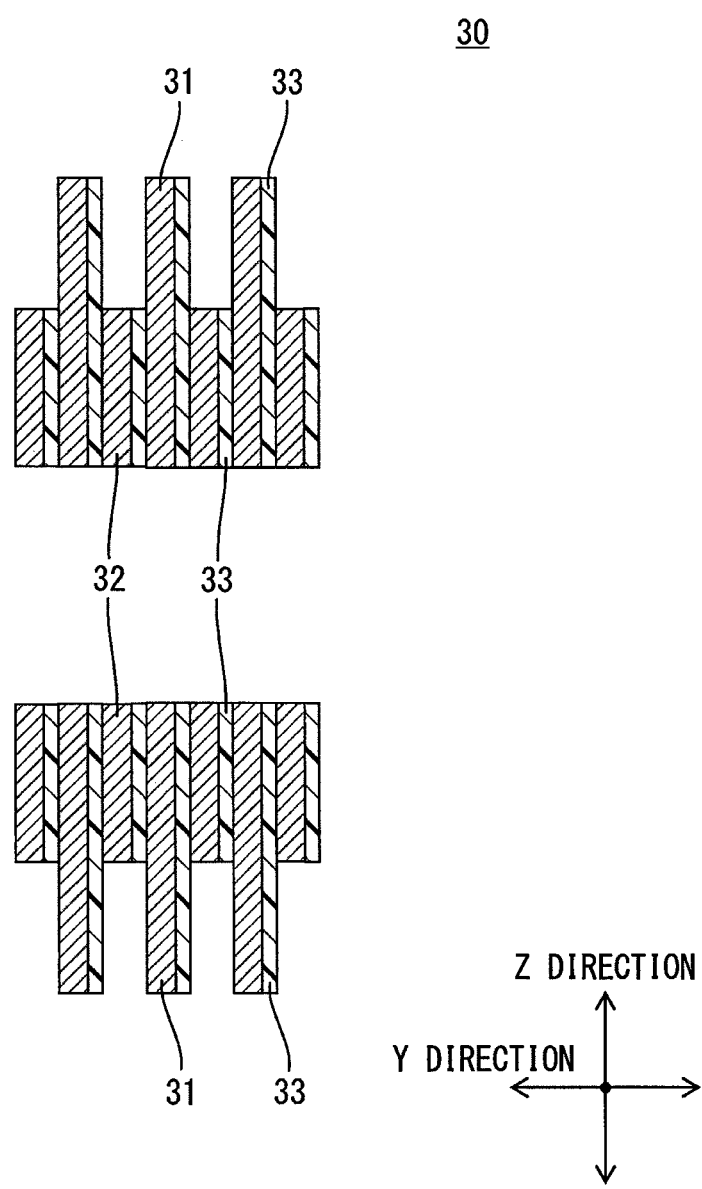
FIG. 10 is a cross sectional view showing another modification of the magnetic field concentrating core.
Figure 11:
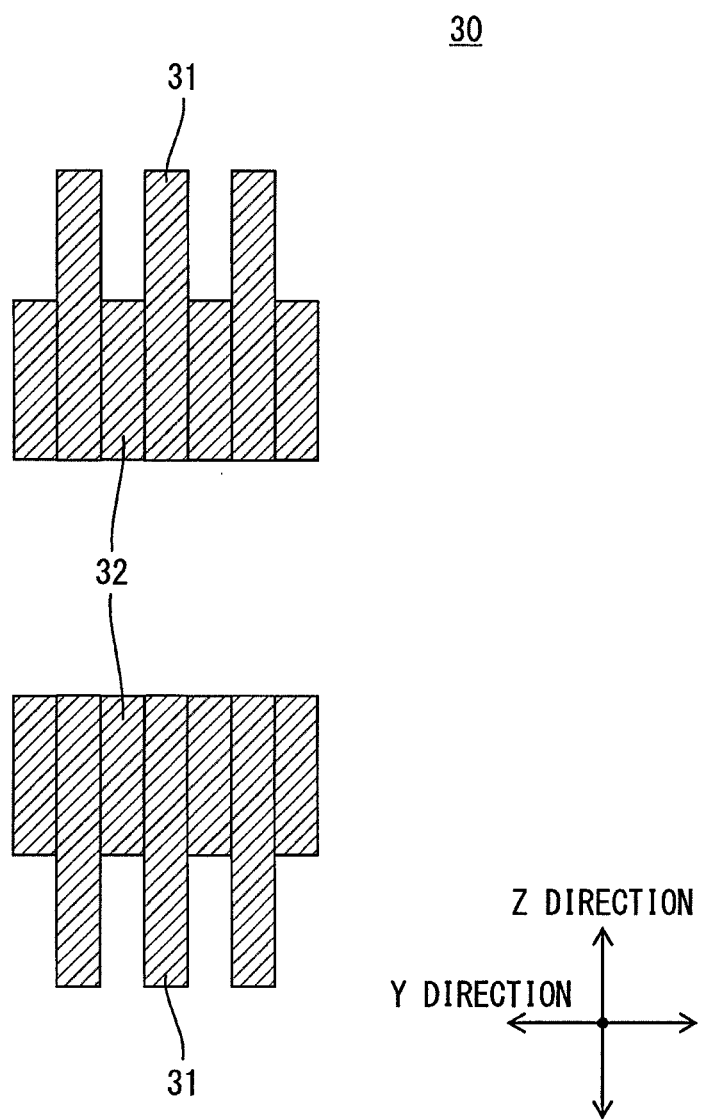
FIG. 11 is a cross sectional view showing another modification of the magnetic field concentrating core.

Furthermore, as shown in FIGS. 9 to 11, a constitution may be provided such that the main surface of the inside portion of the first magnetic material 31 and a whole of the main surface of the second magnetic material 32, and one ends of the first magnetic materials 31 adjacent to each other are opposed to each other via the clearance. In this modification, the length of the second magnetic material 32 in the Z direction is shorter than the first magnetic material 31.

Here, in the above modification, when the length of the second magnetic material 32 in the Y direction is shorter than the first magnetic material 31, a distance between one ends of the first magnetic materials 31 adjacent to each other via the second magnetic material 32 is shortened. Accordingly, these one ends are electrically connected to each other, so that a region electrically connected by the one ends also provides a generation region of the eddy current. Thus, the measurement object magnetic field may be reduced by the eddy current. Accordingly, it is preferable that the length of the second magnetic material 32 in the Y direction is longer than the first magnetic material 31. In this case, the reduction of the measurement object magnetic field caused by the eddy current is restricted, the eddy current being provided such that the one ends are electrically connected to each other, so that the region electrically connected by the one ends also provides the generation region of the eddy current.

The present embodiment provides an example such that the first magnetic materials 31 are adjacent to each other via one second magnetic material 32. However, the number of second magnetic materials 32 formed between the first magnetic materials 31 is not limited to the above example. For example, as shown in FIG. 12, a constitution may be provided such that the first magnetic materials 31 are adjacent to each other via two second magnetic materials 32.

The present embodiment provides an example such that the second magnetic materials 32 are adjacent to each other via one first magnetic material 31. However, the number of first magnetic materials 31 formed between the second magnetic materials 32 is not limited to the above example. For example, as shown in FIG. 13, a constitution may be provided such that the second magnetic materials 32 are adjacent to each other via two first magnetic materials 31.

In the present embodiment, the shape of the magnetic field concentrating core 30 is explained. The manufacturing method of the magnetic field concentrating core 30 is not described specifically. The magnetic field concentrating core 30 is manufactured such that the first magnetic material 31 and the second magnetic material 32 are stacked in the Y direction, and they are heated and pressurized in the Y direction in each of a case where the first magnetic material 31 and the second magnetic material 32 are bonded to each other via the insulation material 33 and a case where the first magnetic material 31 and the second magnetic material 32 are bonded to each other without the insulation material 33. Alternatively, the magnetic field concentrating core 30 may be manufactured by another method such that magnetic materials 34 having a planar shape on the X-Z plane, which is a ring shape with a gap, and different diameters are stacked in multiple layers from a center of the magnetic materials 34 to an outside of the magnetic materials 34. Here, after the plates having the ring shape are stacked in multiple layers, a part of the multiple layers may be removed so that the gap is formed. In these cases, the magnetic field concentrating core 30 shown in FIGS. 2 and 4 to 13 is manufactured. The boundary between the magnetic materials 31, 32 is merely shown in FIGS. 2 and 4 to 13 in order to clarify the position of each material 31, 32. Accordingly, the boundary is not shown in order to specify that each magnetic field concentrating core 30 is manufactured by the first described method. Even when one of the above described manufacturing methods is applied, the magnetic field concentrating core 30 is manufactured. The magnetic materials 31, 32 provided by the above described manufacturing methods have specific shapes, respectively. The magnetic materials 31, 32 are merely described conceptually, so that the magnetic materials 31, 32 are not limited to the specific shapes, respectively.

Here, when the first magnetic material 31 and the second magnetic material 32 are bonded to each other without the insulation material 33, the magnetic field concentrating core 30 shown in FIGS. 5, 8 and 11 is manufactured such that sintering material is filled in a mold with a cavity having the same shape as the outline of the magnetic field concentrating core 30 shown in FIGS. 5, 8 and 11, and the sintering material is heated and pressurized. Alternatively, the magnetic field concentrating core 30 shown in FIGS. 5, 8 and 11 may be manufactured such that powder compacting material coated with resin is filled in a mold having the same shape as the outline of the magnetic field concentrating core 30 shown in FIGS. 5, 8 and 11, and the powder compacting material is heated and pressurized. In these cases, the boundary between the magnetic materials 31, 32 is not formed.

The present embodiment provides an example such that the case 60 is made of resin mold for fixing the sensor substrate 10, the circuit board 40 and the support substrate 50 integrally and for covering and protecting the sensor substrate 10, the circuit board 40 and the support substrate 50. The case 60 may be any as long as the case 60 provides a function for accommodating the sensor substrate 10, the circuit board 40 and the support substrate 50 and is made of material having non-magnetism and insulating properties. For example, the case 60 may have a cylindrical shape. After the sensor substrate 10, the circuit board 40 and the support substrate 50 are arranged in the case 60, resin is injected and solidified so that the sensor substrate 10, the circuit board 40 and the support substrate 50 are fixed in the case 60.

The present disclosure has the following aspects.

According to an aspect of the present disclosure, a current sensor includes: a magneto electric conversion element for converting an applied magnetic field to an electric signal; and a magnetic field concentrating core for concentrating a measurement object magnetic field caused by a measurement object current and for applying a concentrated measurement object magnetic field to the magneto electric conversion element. The magnetic field concentrating core has a planar shape perpendicular to a flowing direction of the measurement object current, the planar shape being a ring shape with a gap. The magneto electric conversion element is arranged in the gap. A part of a measurement object conductor, through which an alternating current as the measurement object current flows, is surrounded by the magnetic field concentrating core. The magnetic field concentrating core includes at least two first magnetic members made of a first magnetic material and at least one second magnetic member made of a second magnetic material, the at least two first magnetic members and the at least one second magnetic member being stacked alternately in the flowing direction of the alternating current. Parts of the at least two first magnetic members, which are adjacent to each other via the at least one second magnetic member, are opposed to each other through a clearance or an insulator.

In the above current sensor, the magnetic field concentrating core includes the first magnetic material and the second magnetic material, which are alternately stacked. The parts of the first magnetic materials, which are adjacent to each other via the second magnetic material, are opposed to each other through the clearance or the insulator. Thus, a cross sectional area of the magnetic field concentrating core is the same as a case where a whole of the first magnetic material and a whole of the second magnetic material are connected to each other. However, a total length of an outline of an outer shape of the cross sectional shape of the magnetic field concentrating core is elongated. Further, an eddy current flowing through the parts of the first magnetic materials, which are not connected to the second magnetic material, is cancelled with each other. In this case, a generation region of a macroscopic eddy current is a region, at which the parts of the first magnetic materials and the second magnetic material are connected to each other. Accordingly, a magnitude of a substantial eddy current becomes small. Thus, as described above, since the macroscopic eddy current becomes small, the variation of a distribution of the measurement object magnetic field flowing through the magnetic field concentrating core caused by the eddy current is restricted.

Here, the cross sectional area of the magnetic field concentrating core and the surface area of a facing surface of an end, which provides the gap, are provided by other parts of the first magnetic materials and the second magnetic material, which are connected to each other, and the parts of the first magnetic materials, which are opposed to each other via the clearance or the insulator. The measurement object magnetic field discharged from the facing surface is in proportion to the surface area of the facing surface. Accordingly, the reduction of the measurement object magnetic field applied to the magneto electric conversion element is restricted, compared with a case where the surface area of the facing surface is provided by the first magnetic materials and the second magnetic material, which are connected to each other.

Thus, as described above, the variation of the distribution of the measurement object magnetic field flowing through the magnetic field concentrating core and the reduction of the measurement object magnetic field are restricted.

Alternatively, the current sensor may further include: one more second magnetic member. The at least two first magnetic members and at least two second magnetic members are alternately stacked in the flowing direction of the alternating current. Each of the at least two first magnetic members and the at least two second magnetic members has the planar shape perpendicular to the flowing direction of the alternating current, the planar shape being the ring shape with the gap. An inside portion of the ring shape of the first magnetic member and an outside portion of the ring shape of the second magnetic member are connected to each other. Outside portions of the ring shape of the at least two first magnetic members adjacent to each other via the at least one second magnetic member are opposed to each other via the clearance or the insulator. Inside portions of the ring shape of the at least two second magnetic members adjacent to each other via at least one first magnetic member are opposed to each other via a clearance or an insulator. In this case, the cross sectional area of the magnetic field concentrating core and the surface area of the facing surface are provided by parts of the first magnetic materials and a part of the second magnetic material, which are connected to each other, outer portions of the first magnetic materials and an inner portion of the second magnetic material. Accordingly, the reduction of the measurement object magnetic material applied to the magneto electric conversion element is restricted, compared with a case where the surface area of the facing surface is provided by the first magnetic materials and the second magnetic material, which are connected to each other.

Alternatively, the inside portions of two second magnetic members adjacent to each other via only one first magnetic member (31) may be opposed to each other via the clearance or the insulator. In this case, the increase of the dimensions of the magnetic field concentrating core is restricted, compared with a case where the inside portions of the second magnetic materials adjacent to each other via multiple first magnetic materials are opposed to each other via the clearance or the insulator. Thus, the increase of the dimensions of the current sensor is restricted.

Alternatively, a center portion of the first magnetic member and the at least one second magnetic member may be connected to each other. One of outside portions and inside portions of the ring shape of two first magnetic members adjacent to each other via the at least one second magnetic member are opposed to each other via the clearance or the insulator.

Alternatively, the other one of the outside portions and the inside portions of the ring shape of two first magnetic members adjacent to each other via the at least one second magnetic member may be opposed to each other via the clearance or the insulator. In this case, the cross sectional area of the magnetic field concentrating core and the surface area of the facing surface are provided by parts of the first magnetic materials and a part of the second magnetic material, which are connected to each other, outer portions of the first magnetic materials and an inner portion of the second magnetic material. Accordingly, the reduction of the measurement object magnetic material applied to the magneto electric conversion element is restricted, compared with a case where the surface area of the facing surface is provided by the first magnetic materials and the second magnetic material, which are connected to each other.

When the length of the second magnetic material in the flowing direction is shorter than the first magnetic material, a distance between one (hereinafter, defined as one sides) of the outside portions and the inside portions of the first magnetic materials, which are adjacent to each other via the second magnetic material, is shortened. Accordingly, the one sides are electrically connected to each other, so that the region electrically connected also provides a generation region of the eddy current, and therefore, the measurement object magnetic field may be reduced by the eddy current. Accordingly, alternatively, each second magnetic member may have a width in the flowing direction of the alternating current longer than the first magnetic member. In this case, the reduction of the measurement object magnetic field caused by the eddy current is restricted, the eddy current being generated when the one sides are electrically connected to each other so that the region electrically connected provides the generation region of the eddy current.

Alternatively, the parts of the at least two first magnetic members adjacent to each other via only one second magnetic member may be opposed to each other via the clearance or the insulator. In this case, the increase of the dimensions of the magnetic field concentrating core is restricted, compared with a case where the parts of the first magnetic materials adjacent to each other via multiple second magnetic materials are opposed to each other via the clearance or the insulator. Thus, the increase of the dimensions of the current sensor is restricted.

Alternatively, each of the at least two first magnetic member and the second magnetic member may be bonded to each other via an insulation material. In this case, the electrical coupling between the magnetic materials (31, 32) is reduced, so that the generation of the eddy current is restricted. Thus, the reduction of the measurement object magnetic field flowing through the magnetic field concentrating core is restricted, and therefore, the reduction of the detection accuracy of the current is restricted.

Alternatively, the current sensor may further include: a circuit board, on which a processing circuit for processing an output signal from the magneto electric conversion element is arranged.

Alternatively, the current sensor may further include: a support substrate for supporting the magneto electric conversion element and the circuit board.

Alternatively, the current sensor may further include: a case for accommodating the magneto electric conversion element, the circuit board, the support substrate and the magnetic field concentrating core.

Alternatively, the magnetic field concentrating core includes two ends, which faces each other. The gap is provided between the two ends. Each end has a facing surface, which includes an addition surface. The addition surface includes a part of a cross section of the first magnetic member connected to the second magnetic member and a part of a cross section of the second magnetic member connected to the first magnetic member. The addition surface is a cross section, which is obtained as a sum of the part of the cross section of the first magnetic member and the part of the cross section of the second magnetic member. The addition surface has a surface area equal to or larger than the facing surface of the magneto electric conversion element.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A current sensor comprising:
   a magneto electric conversion element for converting an applied magnetic field to an electric signal; and
   a magnetic field concentrating core for concentrating a measurement object magnetic field caused by a measurement object current and for applying a concentrated measurement object magnetic field to the magneto electric conversion element,
   wherein the magnetic field concentrating core has a planar shape perpendicular to a flowing direction of the measurement object current, the planar shape being a ring shape with a gap,
   wherein the magneto electric conversion element is arranged in the gap,
   wherein a part of a measurement object conductor, through which an alternating current as the measurement object current flows, is surrounded by the magnetic field concentrating core,
   wherein the magnetic field concentrating core includes at least two first magnetic members made of a first magnetic material and at least one second magnetic member made of a second magnetic material, the at least two first magnetic members and the at least one second magnetic member being stacked alternately in the flowing direction of the alternating current,
   wherein parts of the at least two first magnetic members, which are adjacent to each other via the at least one second magnetic member, are opposed to each other through a clearance in the flowing direction,
   the at least one second magnetic member includes at least two second magnetic members,
   wherein the at least two first magnetic members and the at least two second magnetic members are alternately stacked in the flowing direction of the alternating current,
   wherein each of the at least two first magnetic members and the at least two second magnetic members has the planar shape perpendicular to the flowing direction of the alternating current, the planar shape being the ring shape with the gap,
   wherein an inside portion of the ring shape of the first magnetic member and an outside portion of the ring shape of the second magnetic member are connected to each other,
   wherein outside portions of the ring shape of the at least two first magnetic members adjacent to each other via the at least one second magnetic member are opposed to each other via the clearance in the flowing direction, and
   wherein inside portions of the ring shape of the at least two second magnetic members adjacent to each other via at least one first magnetic member are opposed to each other via a clearance in the flowing direction.

2. The current sensor according to claim 1,
   wherein the inside portions of two second magnetic members adjacent to each other via only one first magnetic member are opposed to each other via the clearance or an insulator.

3. A current sensor comprising:
   a magneto electric conversion element for converting an applied magnetic field to an electric signal; and
   a magnetic field concentrating core for concentrating a measurement object magnetic field caused by a measurement object current and for applying a concentrated measurement object magnetic field to the magneto electric conversion element, wherein the magnetic field concentrating core has a planar shape perpendicular to a flowing direction of the measurement object current, the planar shape being a ring shape with a gap, wherein the magneto electric conversion element is arranged in the gap, wherein a part of a measurement object conductor, through which an alternating current as the measurement object current flows, is surrounded by the magnetic field concentrating core, wherein the magnetic field concentrating core includes at least two first magnetic members made of a first magnetic material and at least one second magnetic member made of a second magnetic material, the at least two first magnetic members and the at least one second magnetic member being stacked alternately in the flowing direction of the alternating current, wherein parts of the at least two first magnetic members, which are adjacent to each other via the at least one second magnetic member, are opposed to each other through a clearance in the flowing direction, wherein a center portion of the first magnetic member and the at least one second magnetic member are connected to each other, and wherein one of outside portions and inside portions of the ring shape of two first magnetic members adjacent to each other via the at least one second magnetic member are opposed to each other via the clearance in the flowing direction.

4. The current sensor according to claim 3,
wherein the other one of the outside portions and the inside portions of the ring shape of two first magnetic members adjacent to each other via the at least one second magnetic member are opposed to each other via the clearance or an insulator.

5. The current sensor according to claim 1,
wherein each second magnetic member has a width in the flowing direction of the alternating current longer than the first magnetic member.

6. The current sensor according to claim 1,
wherein the parts of the at least two first magnetic members adjacent to each other via only one second magnetic member are opposed to each other via the clearance or an insulator.

7. The current sensor according to claim 1,
wherein each of the at least two first magnetic member and the second magnetic member are bonded to each other via an insulation material.

8. The current sensor according to claim 1, further comprising:
a circuit board, on which a processing circuit for processing an output signal from the magneto electric conversion element is arranged.

9. The current sensor according to claim 8, further comprising:
a support substrate for supporting the magneto electric conversion element and the circuit board.

10. The current sensor according to claim 9, further comprising:
a case for accommodating the magneto electric conversion element, the circuit board, the support substrate and the magnetic field concentrating core.

* * * * *